(12) United States Patent
Lee et al.

(10) Patent No.: US 11,018,094 B2
(45) Date of Patent: May 25, 2021

(54) SEMICONDUCTOR PACKAGES CONFIGURED FOR MEASURING CONTACT RESISTANCES AND METHODS OF OBTAINING CONTACT RESISTANCES OF THE SEMICONDUCTOR PACKAGES

(71) Applicant: SK hynix Inc., Icheon-si (KR)

(72) Inventors: Ki Yong Lee, Seoul (KR); Se Jin Park, Yongin-si (KR); Hyoung Min Im, Icheon-si (KR); Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/597,138

(22) Filed: Oct. 9, 2019

(65) Prior Publication Data

US 2020/0191860 A1 Jun. 18, 2020

(30) Foreign Application Priority Data

Dec. 13, 2018 (KR) .................. 10-2018-0161341

(51) Int. Cl.
| | |
|---|---|
| *H01L 23/552* | (2006.01) |
| *G01R 31/27* | (2006.01) |
| *G01R 27/08* | (2006.01) |
| *H01L 23/528* | (2006.01) |
| *H01L 23/522* | (2006.01) |

(Continued)

(52) U.S. Cl.
CPC ............ *H01L 23/552* (2013.01); *G01R 27/08* (2013.01); *G01R 31/2601* (2013.01); *G01R 31/27* (2013.01); *H01L 23/5226* (2013.01); *H01L 23/5283* (2013.01); *H05K 9/0009* (2013.01); *H01L 2225/06537* (2013.01); *H01L 2924/3025* (2013.01)

(58) Field of Classification Search
CPC .... G01R 31/27; G01R 27/08; G01R 31/2601; H01L 23/5226; H01L 23/5283; H01L 23/552; H01L 2225/06537; H01L 2924/3025; H05K 9/0009
See application file for complete search history.

(56) References Cited

U.S. PATENT DOCUMENTS

| | | | |
|---|---|---|---|
| 8,766,654 B2 | 7/2014 | Ding et al. | |
| 2012/0270368 A1* | 10/2012 | Lee ..................... | H01L 24/97 438/112 |

(Continued)

*Primary Examiner* — Feifei Yeung Lopez
(74) *Attorney, Agent, or Firm* — William Park & Associates Ltd.

(57) ABSTRACT

A method of obtaining contact resistance values of a semiconductor package, the semiconductor package includes a package substrate, a semiconductor chip mounted on the package substrate, a molding member disposed on the package substrate to surround the semiconductor chip, and an electromagnetic interference (EMI) shielding layer disposed on side surfaces of the package substrate and on the molding member. The package substrate includes a substrate body having a first surface and a second surface which are opposite to each other, first to fourth upper interconnection patterns disposed on the first surface of the substrate body in a first region of the package substrate and in contact with the EMI shielding layer, and an interconnection structure disposed in a second region of the package substrate.

7 Claims, 13 Drawing Sheets

(51) Int. Cl.
 G01R 31/26 (2020.01)
 H05K 9/00 (2006.01)

(56) References Cited

U.S. PATENT DOCUMENTS

2015/0035127 A1* 2/2015 Yang ................. H01L 23/60
 257/659
2015/0179588 A1* 6/2015 Choi ................. H01L 23/552
 257/659

* cited by examiner

SEMICONDUCTOR PACKAGES CONFIGURED FOR MEASURING CONTACT RESISTANCES AND METHODS OF OBTAINING CONTACT RESISTANCES OF THE SEMICONDUCTOR PACKAGES

CROSS-REFERENCE TO RELATED APPLICATIONS

The present application claims priority under 35 U.S.C 119(a) to Korean Application No. 10-2018-0161341, filed on Dec. 13, 2018, which is herein incorporated by references in its entirety.

BACKGROUND

1. Technical Field

Various embodiments of the present disclosure generally relate to semiconductor packages and, more particularly, to semiconductor packages which are configured for being measured for contact resistances and methods for obtaining contact resistances of the semiconductor packages.

2. Related Art

An electromagnetic interference (hereinafter, referred to as EMI) phenomenon may occur due to electromagnetic signals which is unnecessarily generated by radiated emission or conductive emission of an electronic circuit. The EMI phenomenon may disturb operations of adjacent electronic devices to degrade the performance of the adjacent electronic devices or to cause malfunction of the adjacent electronic devices. In order to suppress the EMI phenomenon, it may be necessary to design the electronic circuit (or an electronic system) such that high frequency noises are not essentially generated or to shield the electronic circuit (or the electronic system) such that the high frequency noises generated from the electronic circuit (or the electronic system) are not propagated out. In case of semiconductor packages, an EMI shielding layer surrounding a top surface and sidewalls of each semiconductor package may be employed to shield the high frequency noises generated by an internal chip in the semiconductor package or generated by an external device located in an outside region of the semiconductor package.

SUMMARY

According to an embodiment, there is provided a semiconductor package. The semiconductor package may include a package substrate, a semiconductor chip mounted on the package substrate, a molding member disposed on the package substrate to surround the semiconductor chip, and an electromagnetic interference (EMI) shielding layer disposed on side surfaces of the package substrate and on the molding member. The package substrate may include a substrate body having a first surface and a second surface which are opposite to each other, first to fourth upper interconnection patterns disposed on the first surface the substrate body in a first region of the package substrate and in contact with the EMI shielding layer, and an interconnection structure including a first additional interconnection pattern and a second additional interconnection pattern, the interconnection structure disposed in a second region of the package substrate.

According to an embodiment, there is provided a method of obtaining contact resistance values of a semiconductor package including a package substrate, a semiconductor chip mounted on the package substrate, a molding member disposed on the package substrate to surround the semiconductor chip, and an electromagnetic interference (EMI) shielding layer disposed on side surfaces of the package substrate and on the molding member. The package substrate may include a substrate body having a first surface and a second surface which are opposite to each other. The method may include measuring a total resistance value corresponding to a sum of resistance values of second and third upper interconnection patterns, a resistance value of an inner EMI shielding layer disposed between the second and third upper interconnection patterns, a contact resistance value between the second upper interconnection pattern and the inner EMI shielding layer, and a contact resistance value between the third upper interconnection pattern and the inner EMI shielding layer by applying and detecting signals to and from the second and third interconnection patterns, wherein the second and third upper interconnection patterns and first and fourth upper interconnection patterns are disposed on the first surface of the substrate body in a first region of the package substrate and are in contact with the EMI shielding layer. The method may include measuring the resistance value of the inner EMI shielding layer by applying and detecting signals to and from the first, second, third, and fourth upper interconnection patterns. The method may include measuring a resistance value of a connection pattern included in an interconnection structure disposed in a second region of the package substrate. The method may include calculating the resistance values of the second and third upper interconnection patterns using the resistance value of the connection pattern. The method may include subtracting the resistance values of the second and third upper interconnection patterns calculated using the resistance value of the connection pattern from the total resistance value and subtracting the resistance value of the inner EMI shielding layer measured by applying and detecting signals to and from the first, second, third, and fourth upper interconnection patterns from the total resistance value to obtain the contact resistance values between the inner EMI shielding layer and the second upper interconnection pattern as well as between the inner EMI shielding layer and the third upper interconnection pattern.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

For the following description of embodiments, it will be understood that the terms "first" and "second" are intended to identify an element, but are not used to define the element itself or imply a particular sequence or hierarchy. In addition, when an element is referred to as being located "on," "over," "above," "under," or "beneath" another element, a relative positional relationship is indicated, regardless of the presence or absence of intervening elements. Accordingly, the terms such as "on," "over," "above," "under," "beneath," "below," and the like that are used herein are for the purpose of describing particular embodiments only and are not intended to limit the scope of the present disclosure. Further, when elements are referred to as being "connected" or "coupled" to one another, the elements may be electrically or mechanically connected or coupled directly without intervening elements or indirectly with intervening elements.

Various embodiments may be directed to semiconductor packages which are configured for being measured for contact resistance values. Various embodiments may be directed to methods for obtaining contact resistance values of the semiconductor packages.

During the fabrication of semiconductor packages, an EMI shielding layer may be formed after a molding layer is formed. That is, after a chip is attached to a package substrate and the molding layer is formed to cover the chip, the EMI shielding layer may be formed to cover a top surface of the molding layer and side surfaces of the package substrate. The EMI shielding layer has to be electrically connected to a ground signal path, for example, an interconnection pattern which is disposed in the package substrate and is connected to a ground terminal. Thus, it may be necessary that the EMI shielding layer is in physical contact with an end of the grounded interconnection pattern. In such a case, a contact resistance value between the EMI shielding layer and the grounded interconnection pattern may significantly affect the function of the EMI shielding layer. Thus, after the EMI shielding layer is formed, it may be necessary to measure the contact resistance values between the EMI shielding layer and the grounded interconnection patterns and to discriminate whether the contact resistance values are within an allowable range.

Various embodiments of the present disclosure may provide semiconductor packages used in direct measurement of the contact resistance values between the EMI shielding layer and ground lines (i.e., grounded interconnection patterns) being in contact with the EMI shielding layer with a two-wire probing technique and a four-wire probing technique.

Figure 1:
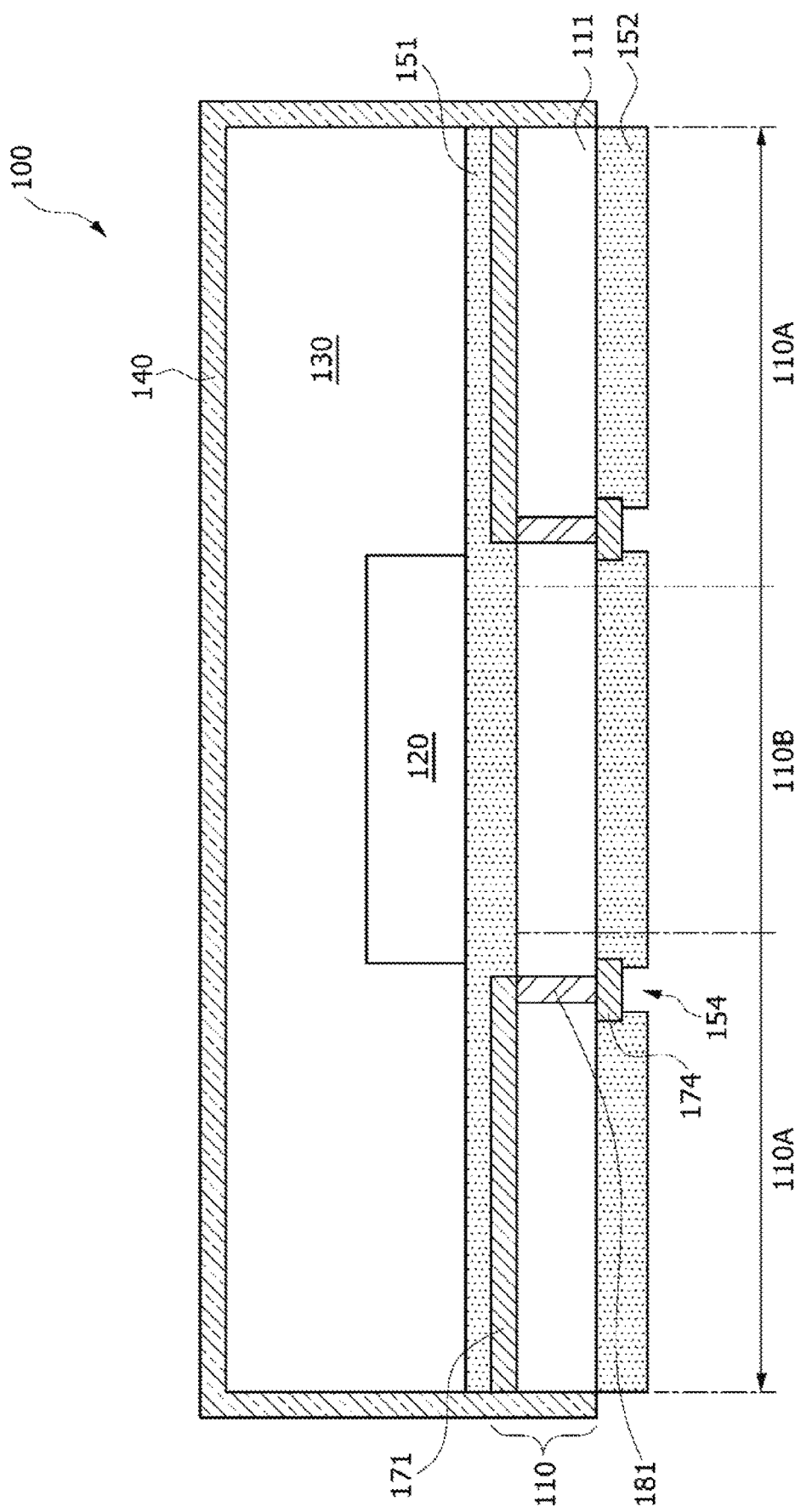
FIG. 1 is a cross-sectional view illustrating a semiconductor package according to an embodiment of the present disclosure.
Figure 2:
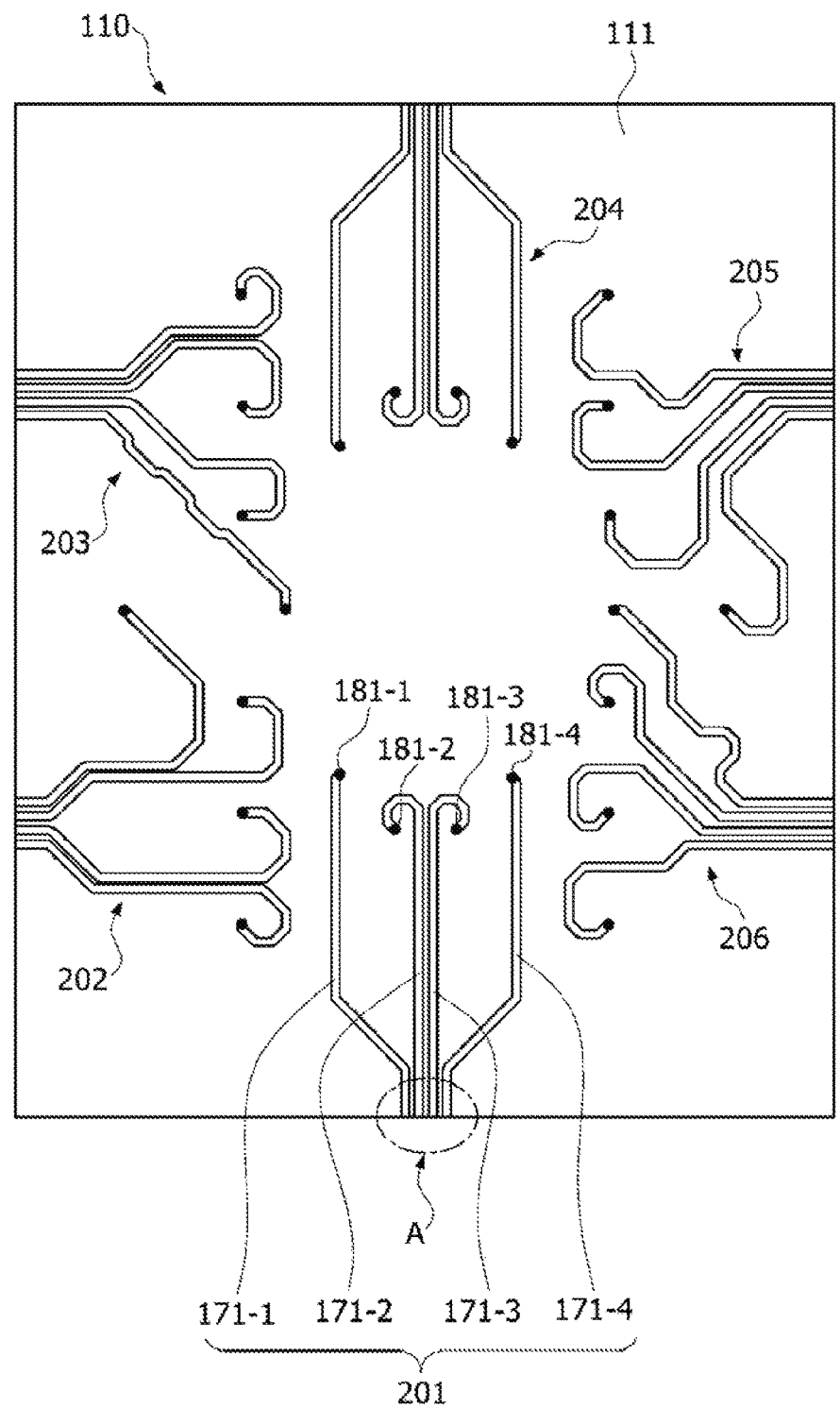
FIGS. 2 and 3 are layout diagrams illustrating examples of an upper interconnection pattern structure and a lower interconnection pattern structure disposed in a first region of a semiconductor package according to an embodiment of the present disclosure.
Figure 3:
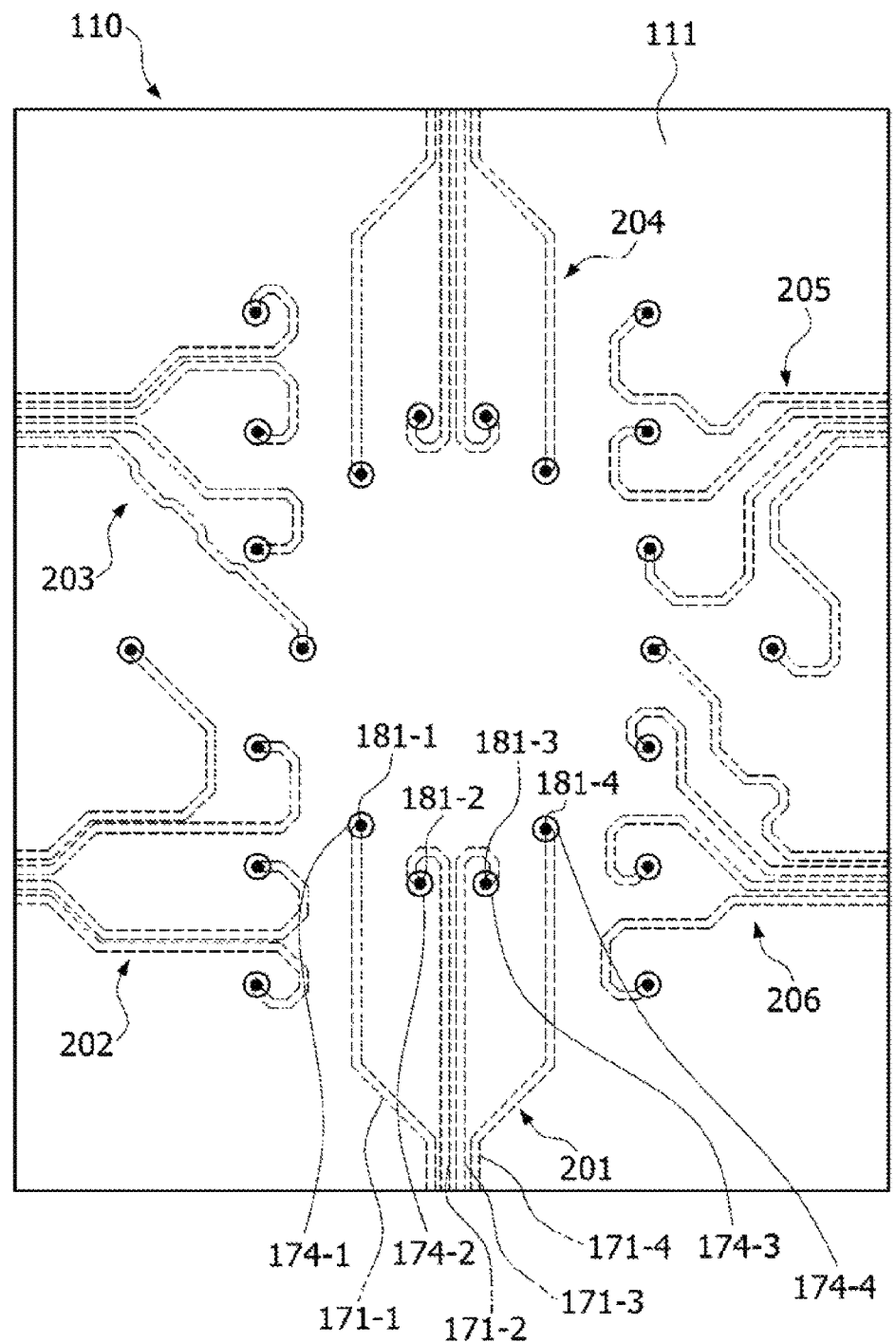

FIG. 1 is a cross-sectional view illustrating a semiconductor package 100 according to an embodiment of the present disclosure. FIG. 2 is a layout diagram illustrating upper interconnection patterns and vias disposed in a first region 110A of a package substrate 110 included in the semiconductor package 100 of FIG. 1, and FIG. 3 is a layout diagram illustrating lower interconnection patterns and the vias disposed in the first region 110A of the package substrate 110 included in the semiconductor package 100 of FIG. 1. In FIG. 3, the upper interconnection patterns are illustrated with dotted lines to show connection relationships between the upper interconnection patterns and the lower interconnection patterns. Referring to FIG. 1, the semiconductor package 100 may be configured to include the package substrate 110, a chip 120, a molding member 130 and an EMI shielding layer 140. An upper solder resist layer 151 and a lower solder resist layer 152 may be disposed on a top surface and a bottom surface of the package substrate 110, respectively. The chip 120 may be disposed on the package substrate 110, for example, on a surface of the upper solder resist layer 151 opposite to the package substrate 110. Although not shown in the drawings, the chip 120 may be electrically connected to the interconnection patterns in the package substrate 110 through connection members such as wires or bumps. The molding member 130 may be disposed on the package substrate 110 to surround the chip 120. The molding member 130 may be disposed to expose side surfaces of the package substrate 110. The EMI shielding layer 140 may be disposed on the exposed side surfaces of the package substrate 110 as well as a top surface and side surfaces of the molding member 130.

The package substrate 110 may include a substrate body 111 comprised of an insulation layer as well as upper and lower interconnection patterns 171 and 174 which are respectively disposed on a top surface and a bottom surface of the substrate body 111. Although FIG. 1 illustrates an embodiment in which the upper interconnection patterns 171 and the lower interconnection patterns 174 of the package substrate 110 have a single-layered interconnection pattern structure, the embodiment illustrated in FIG. 1 is merely an example of the present disclosure. For example, in some other embodiments, the package substrate 110 may have a multi-layered board structure. In such a case, the package substrate 110 may include interconnection patterns located at a plurality of different levels on at least one of the top and bottom surfaces of the substrate body 111. The package substrate 110 may have the first region 110A and a second region 110B. In an embodiment, the first region 110A may include edge portions of the package substrate 110 when viewed from a plan view, and the second region 110B may be surrounded by the first region 110A in the plan view. In the present embodiment, the first region 110A may be defined as a region in which the interconnection patterns contacting the EMI shielding layer 140 are disposed. The second region 110B may be defined as a region in which an additional interconnection pattern structure for measuring resistance values of the interconnection patterns contacting the EMI shielding layer 140 is disposed. In an embodiment, the first region 110A of the package substrate 110 may be located between the second region 110B of the package substrate 110 and the portion of EMI shielding layer 140 in contact with the interconnection patterns. In FIG. 1, the illustration of the additional interconnection pattern structure disposed in the second region 110B is omitted.

In the first region 110A, the upper interconnection patterns 171 may be disposed on a first surface of the substrate body 111, and the lower interconnection patterns 174 may be disposed on a second surface of the substrate body 111. In an embodiment, the first surface and the second surface of the substrate body 111 may correspond to a top surface and a bottom surface of the substrate body 111, respectively. In an embodiment, the upper interconnection patterns 171 and the lower interconnection patterns 174 may be metal patterns having a relatively high conductivity, for example, copper patterns or nickel patterns. Side surfaces of first ends of the upper interconnection patterns 171 may be in direct contact with the EMI shielding layer 140. In an embodiment, the upper interconnection patterns 171 may be electrically connected to the lower interconnection patterns 174 through vias 181 vertically penetrating the substrate body 111. Although not shown in the drawings, in an embodiment, at least one of the upper interconnection patterns 171 may be electrically connected to any one of the lower interconnection patterns 174 through a connection structure including a plurality of vias. Portions of the lower interconnection patterns 174 may be exposed by openings 154 penetrating the lower solder resist layer 152. Although not shown in the drawings, connection members such as solder balls may be attached to the exposed portions of the lower interconnection patterns 174 through the openings 154 of the lower solder resist layer 152, and the lower interconnection patterns 174 may be electrically connected to an external device through the connection members such as solder balls.

As illustrated in FIG. 2, first to sixth upper interconnection pattern groups 201~206 may be disposed on the top surface of the substrate body 111. Although FIG. 2 illustrates an example in which the first to sixth upper interconnection pattern groups 201~206 are disposed on the top surface of the substrate body 111, the present disclosure is not limited thereto. For example, the number of the upper interconnection pattern groups may be set to be different according to the embodiments. Each of the first to sixth upper interconnection pattern groups 201~206 may include four upper interconnection patterns. For example, the first upper interconnection pattern group 201 located at a lower portion of FIG. 2 may include first to fourth upper interconnection patterns 171-1, 171-2, 171-3 and 171-4. As illustrated in a portion "A" of FIG. 2, first ends of the first to fourth upper interconnection patterns 171-1, 171-2, 171-3 and 171-4 may extend to be vertically aligned with a side surface of the substrate body 111 in a plan view. Second ends of the first to fourth upper interconnection patterns 171-1, 171-2, 171-3 and 171-4 may be connected to first to fourth vias 181-1, 181-2, 181-3 and 181-4 included in the vias 181, respectively. The first ends of the first to fourth upper interconnection patterns 171-1, 171-2, 171-3 and 171-4 constituting the first upper interconnection pattern group 201 may be disposed to be adjacent to each other along the side surface of the substrate body 111. As illustrated in FIG. 1, side surfaces of the first ends of the first to fourth upper interconnection patterns 171-1, 171-2, 171-3 and 171-4 constituting the first upper interconnection pattern group 201 may be revealed without being covered with the upper solder resist layer (151 of FIG. 1). The exposed side surfaces of the first ends of the first to fourth upper interconnection patterns 171-1, 171-2, 171-3 and 171-4 may be in contact with the EMI shielding layer (140 of FIG. 1).

Similarly, each of the second to sixth upper interconnection pattern groups 202~206 may also include four upper interconnection patterns. Side surfaces of first ends of the four upper interconnection patterns constituting each of the second to sixth upper interconnection pattern groups 202~206 may also be vertically aligned with a side surface of the substrate body 111 to be revealed without being covered with the upper solder resist layer (151 of FIG. 1) and may be in contact with the EMI shielding layer (140 of FIG. 1). Second ends of the four upper interconnection patterns constituting each of the second to sixth upper interconnection pattern groups 202~206 may be connected to other vias. Although FIG. 2 illustrates an example in which each of the first to sixth upper interconnection pattern groups 201~206 includes four upper interconnection patterns, the present disclosure is not limited thereto. For example, the number of the upper interconnection patterns included in each of the first to sixth upper interconnection pattern groups 201~206 may be set to be greater than four according to the embodiments. In an embodiment, the upper interconnection patterns included in the first to sixth upper interconnection pattern groups 201~206 may have the same thickness, the same length and the same width. In some embodiments, the upper interconnection patterns included in the first to sixth upper interconnection pattern groups 201~206 may have the same thickness, the same length, the same material, and the same width.

As illustrated in FIG. 3, at least four lower interconnection patterns (i.e., first to fourth lower interconnection patterns 174-1, 174-2, 174-3 and 174-4) may be disposed on the bottom surface of the substrate body 111. All of the vias and the lower interconnection patterns connected to all of the upper interconnection patterns are illustrated in FIG. 3. All of the lower interconnection patterns including the first to fourth lower interconnection patterns 174-1, 174-2, 174-3 and 174-4 may be rounded patterns having a pad shape, as illustrated in FIG. 3. If all of the upper interconnection patterns illustrated with dotted lines have the same resistance value, it may be possible to design the package substrate 110 without the remaining vias and lower interconnection patterns other than four vias and four lower interconnection patterns which are electrically connected to the four upper interconnection patterns constituting any one of the first to sixth upper interconnection pattern groups 201~206. In such a case, first to fourth lower interconnection patterns 174-1, 174-2, 174-3 and 174-4 may be electrically connected to the upper interconnection patterns constituting any one group of the first to sixth upper interconnection pattern groups 201~206 through the vias (181 of FIG. 1), respectively. For example, the first to fourth lower interconnection patterns 174-1, 174-2, 174-3 and 174-4 may be electrically connected to the first to fourth upper interconnection patterns 171-1, 171-2, 171-3 and 171-4 constituting the first upper interconnection pattern group 201 through the first to fourth vias 181-1, 181-2, 181-3 and 181-4, respectively. Although the lower solder resist layer (152 of FIG. 1) is not illustrated in FIG. 3, portions of the lower interconnection patterns may be exposed by the openings 154 of the lower solder resist layer (152 of FIG. 1) and connection members such as solder balls may be attached to the exposed portions of the lower interconnection patterns for signal transmission between the lower interconnection patterns and an external device, as described with reference to FIG. 1.

According to the semiconductor package 100 described above, each of the first to sixth upper interconnection pattern groups 201~206 may be configured to include four upper interconnection patterns, and the four upper interconnection patterns may be in contact with the EMI shielding layer 140 on an edge portion of the substrate body 111. Thus, it may be possible to measure resistance values using a two-wire probing technique and a four-wire probing technique. In order to apply the two-wire probing technique and the four-wire probing technique for measurement of contact resistance values between the EMI shielding layer 140 and the upper interconnection patterns, signals transmitted between an external device and the first to fourth upper interconnection patterns 171-1, 171-2, 171-3 and 171-4 may be independently applied to each other through the first to fourth vias 181-1, 181-2, 181-3 and 181-4 and the first to fourth lower interconnection patterns 174-1, 174-2, 174-3 and 174-4. In an embodiment, signals transmitted between the external device and the first to fourth upper interconnection patterns 171-1, 171-2, 171-3 and 171-4 may be independently applied to each other through the first to fourth vias 181-1, 181-2, 181-3 and 181-4 and the first to fourth lower interconnection patterns 174-1, 174-2, 174-3 and 174-4 through respective connection members, such as solder balls. A method of measuring the contact resistance values between the EMI shielding layer 140 and the upper interconnection patterns will be described below with reference to the drawings later.

Figure 4:
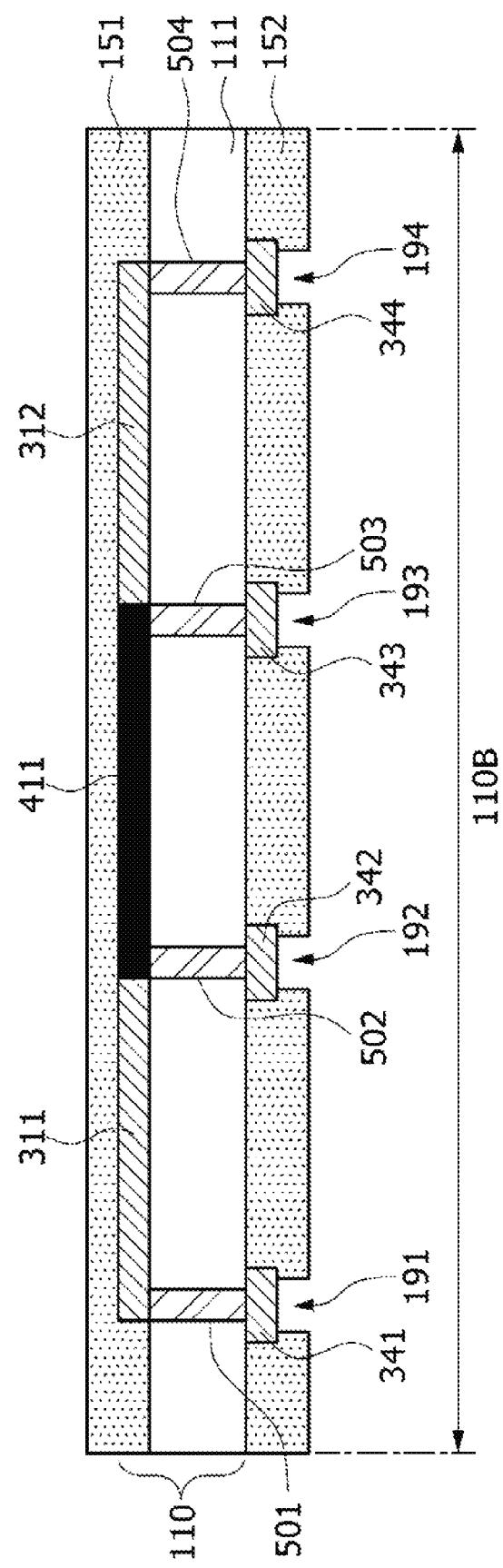
FIG. 4 is a cross-sectional view illustrating an example of an interconnection structure for measuring a pattern resistance value in a second region of a semiconductor package according to an embodiment of the present disclosure.

FIG. 4 is a cross-sectional view illustrating an example of an interconnection structure for measuring a pattern resistance value in the second region 110B of the package substrate 110 included in the semiconductor package 100 according to an embodiment of the present disclosure. Referring to FIG. 4, first and second additional upper interconnection patterns 311 and 312 and a connection pattern 411 may be disposed on a top surface of the substrate body 111 in the second region 110B of the package substrate 110. In an embodiment, the interconnection structure for measuring the pattern resistance value may include first and second additional upper interconnection patterns 311 and 312 and a connection pattern 411. The interconnection structure used for measuring the pattern resistance value including the first and second additional upper interconnection patterns 311 and 312 and the connection pattern 411 may be referred to as an additional interconnection pattern structure. For example, the interconnection structure may include the first and second additional upper interconnection patterns 311 and 312 and the connection pattern 411 disposed on a top surface of the substrate body 111 in the second region 110B of the package substrate 110. The connection pattern 411, for example, may be coupled between the first and second additional upper interconnection patterns. First to fourth additional lower interconnection patterns 341, 342, 343 and 344 may be disposed on a bottom surface of the substrate body 111 in the second region 110B of the package substrate 110. The first to fourth additional lower interconnection patterns 341, 342, 343 and 344 may be exposed by openings 191, 192, 193 and 194 vertically penetrating the lower solder resist layer 152. Although not shown in the drawings, connection members such as solder balls may be attached to the exposed portions of the first to fourth additional lower interconnection patterns 341, 342, 343 and 344 through the openings 191, 192, 193 and 194 of the lower solder resist layer 152, and the first to fourth additional lower interconnection patterns 341, 342, 343 and 344 may be electrically connected to an external device through the connection members such as solder balls.

The connection pattern 411 may be disposed between the first and second additional upper interconnection patterns 311 and 312. That is, one end of the connection pattern 411 may be in contact with one end of the first additional upper interconnection pattern 311, and the other end of the connection pattern 411 may be in contact with one end of the second additional upper interconnection pattern 312. The first additional upper interconnection pattern 311 may be electrically connected to the first additional lower interconnection pattern 341 through a first additional via 501. A top surface of the first additional via 501 may be in contact with a bottom surface of a first end of the first additional upper interconnection pattern 311. The first end of the first additional upper interconnection pattern 311 may be defined as an end of the first additional upper interconnection pattern 311 opposite to the connection pattern 411.

The connection pattern 411 may be electrically connected to the second additional lower interconnection pattern 342 and the third additional lower interconnection pattern 343 through a second additional via 502 and a third additional via 503. A top surface of the second additional via 502 may be in contact with a bottom surface of a first end of the connection pattern 411, and a top surface of the third additional via 503 may be in contact with a bottom surface of a second end of the connection pattern 411. The first end of the connection pattern 411 may be defined as an end of the connection pattern 411 opposite to the second additional upper interconnection pattern 312, and the second end of the connection pattern 411 may be defined as an end of the connection pattern 411 opposite to the first additional upper interconnection pattern 311. In an embodiment, a thickness and a width of the connection pattern 411 may be substantially equal to a thickness and a width of each of the first to fourth upper interconnection patterns (171-1, 171-2, 171-3 and 171-4 of FIG. 2) disposed in the first region (110A of FIG. 1) of the package substrate 110, respectively. In an embodiment, a thickness, width, and material of the connection pattern 411 may be substantially equal to a thickness, width, and material of each of the first to fourth upper interconnection patterns (171-1, 171-2, 171-3 and 171-4 of FIG. 2) disposed in the first region (110A of FIG. 1) of the package substrate 110, respectively.

Signals between an external device (not shown) and the first additional upper interconnection pattern 311, between the external device (not shown) and the second additional upper interconnection pattern 312, and between the external device (not shown) and the connection pattern 411 may be independently applied or detected. For example, an external signal may be independently applied to or detected from an end of the first additional upper interconnection pattern 311 through the first additional lower interconnection pattern 341 and the first additional via 501, and another external signal may be independently applied to or detected from an end of the second additional upper interconnection pattern 312 through the fourth additional lower interconnection pattern 344 and the fourth additional via 504. Moreover, yet another external signal may be independently applied to or detected from the connection pattern 411 through the second and third additional lower interconnection patterns 342 and 343 and the second and third additional vias 502 and 503 to force a current into the connection pattern 411 or to measure a voltage induced between both ends of the connection pattern 411.

Figure 5:
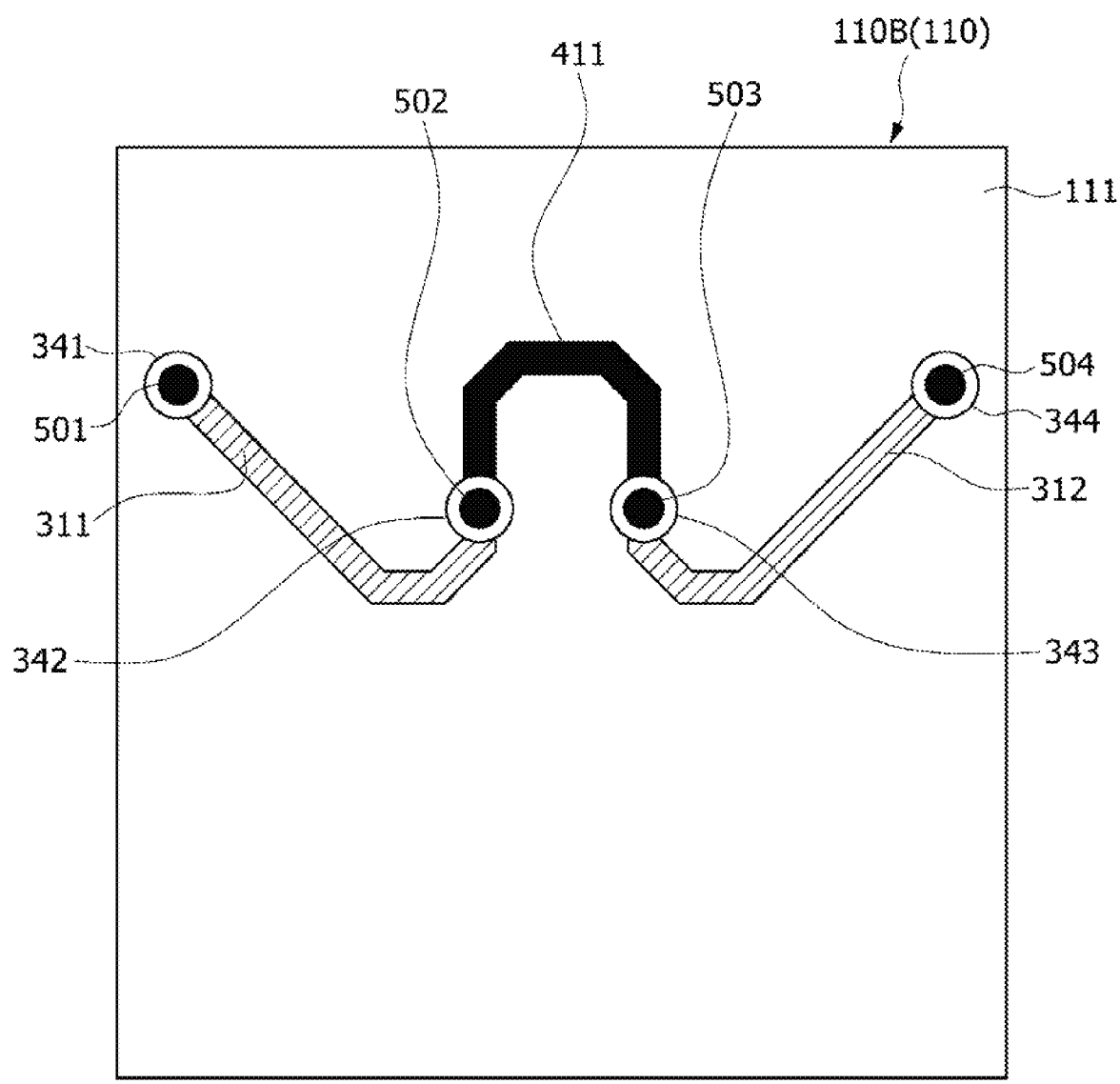
FIG. 5 is a layout diagram illustrating an example of an interconnection structure for measuring a pattern resistance value in a second region of a semiconductor package according to an embodiment of the present disclosure.

FIG. 5 is a layout diagram illustrating an example of an interconnection structure for measuring a pattern resistance value in the second region 110B of the package substrate 110 included in the semiconductor package (100 of FIG. 1) according to an embodiment of the present disclosure. In FIG. 5, the same reference numerals as used in FIG. 4 denote the same elements. For the purpose of ease and convenience in explanation, all of the first and second additional upper interconnection patterns 311 and 312 and the first to fourth additional lower interconnection patterns 341, 342, 343 and 344 are illustrated in FIG. 5. As illustrated in FIG. 4, the first and second additional upper interconnection patterns 311 and 312 may be actually disposed on a top surface of the substrate body 111, and the first to fourth additional lower interconnection patterns 341, 342, 343 and 344 may be disposed on a bottom surface of the substrate body 111.

Referring to FIG. 5, in the second region 110B of the package substrate 110, the first and second additional upper interconnection patterns 311 and 312 may be connected to each other by the connection pattern 411. An end of the first additional upper interconnection pattern 311 may be electrically connected to the first additional lower interconnection pattern 341 through the first additional via 501. Both ends of the connection pattern 411 may be electrically connected to the second and third additional lower interconnection patterns 342 and 343 through the second additional via 502 and the third additional via 503, respectively. An end of the second additional upper interconnection pattern 312 may be electrically connected to the fourth additional lower interconnection pattern 344 through the fourth additional via 504.

A method of measuring contact resistance values according to an embodiment of the present disclosure will be described hereinafter with reference to FIGS. 6 to 13.

Figure 6:
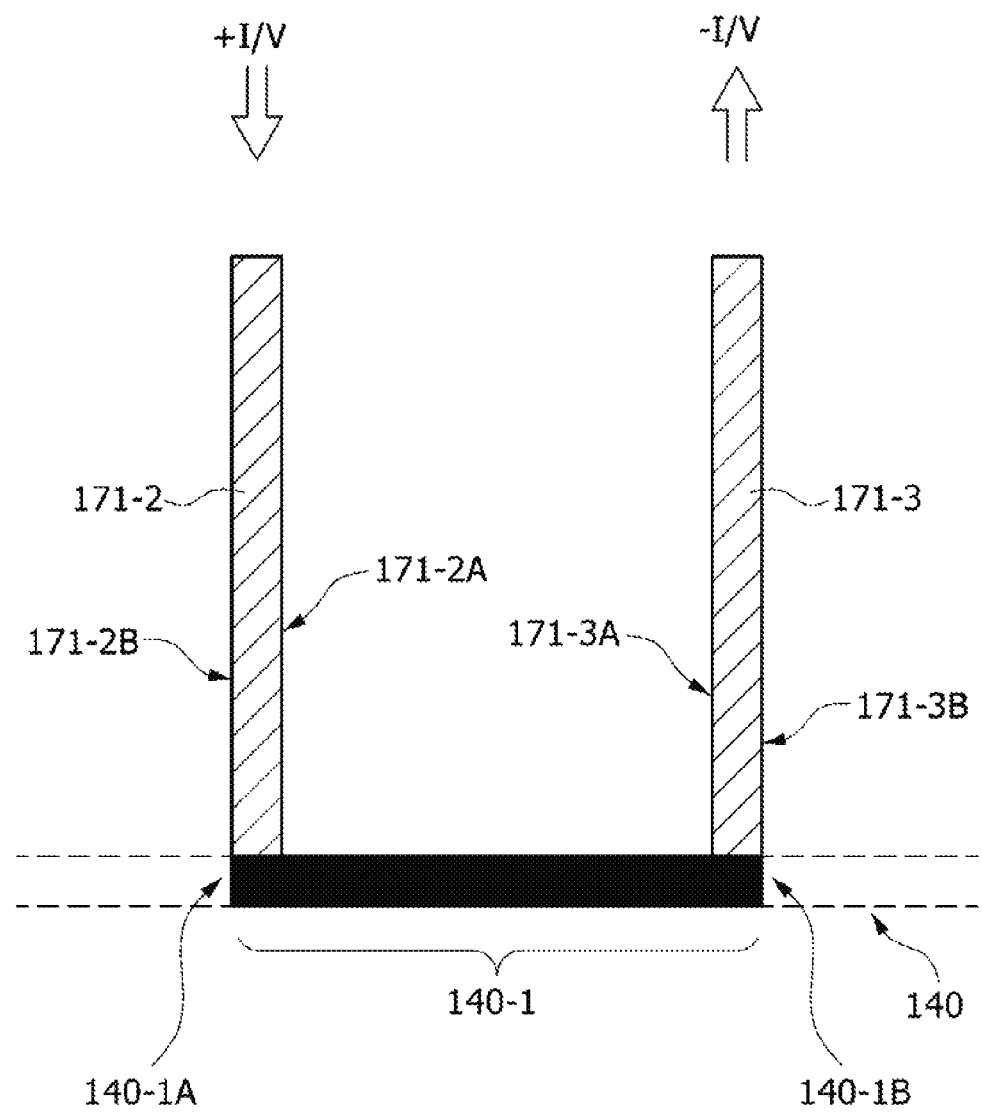
FIGS. 6 to 13 are schematic views illustrating a method of measuring a contact resistance value according to an embodiment of the present disclosure.

FIG. 6 is a schematic view illustrating a first process step of a method for measuring contact resistance values according to an embodiment of the present disclosure. Although the second and third upper interconnection patterns 171-2 and 171-3 are illustrated as straight line-shaped patterns in FIG. 6 for the purpose of ease and convenience in explanation, the second and third upper interconnection patterns 171-2 and 171-3 may have the same shape as illustrated in FIG. 2. In an embodiment, a portion of the EMI shielding layer 140, which is located between a first end 140-1A contacting an end of the second upper interconnection pattern 171-2 and a second end 140-1B contacting an end of the third upper interconnection pattern 171-3, will be referred to as "an inner EMI shielding layer 140-1" hereinafter. The second upper interconnection pattern 171-2 may have an inner side surface 171-2A and an outer side surface 171-2B opposite the inner side surface. In an embodiment, a first end of the inner EMI shielding layer 140-1 may be aligned with the outer side surface 171-2B of the second upper interconnection pattern 171-2. The third upper interconnection pattern 171-3 may have an inner side surface 171-3A and an outer side surface 171-3B opposite the inner side surface. In an embodiment, a second end of the inner EMI shielding layer 140-1 may be aligned with an outer side surface 171-3B of the third upper interconnection pattern 171-3. The outer side surface 171-2B may be defined as a side surface of the second upper interconnection pattern 171-2 opposite to the third upper interconnection pattern 171-3, and the outer side surface 171-3B may be defined as a side surface of the third upper interconnection pattern 171-3 opposite to the second upper interconnection pattern 171-2. The inner side surface 171-2A may be defined as a side surface of the second upper interconnection pattern 171-2 facing the third upper interconnection pattern 171-3. The inner side surface 171-3A may be defined as a side surface of the third upper interconnection pattern 171-3 facing the second upper interconnection pattern 171-2. For example, the inner side surface 171-2A may face in the direction of the inner side surface 171-3A and the inner side surface 171-3A may face in the direction of the inner side surface 171-2A so that both side surfaces face each other.

As illustrated in FIG. 6, the two-wire probing technique may be applied to the second and third upper interconnection patterns 171-2 and 171-3 disposed in the first region 110A of the package substrate 110 of the semiconductor package (100 of FIG. 1) to measure a total resistance value corresponding to a sum of a resistance value of the second upper interconnection pattern 171-2, a resistance value of the third upper interconnection pattern 171-3, a resistance value of the inner EMI shielding layer 140-1, a contact resistance value between the second upper interconnection pattern 171-2 and the inner EMI shielding layer 140-1, and a contact resistance value between the third upper interconnection pattern 171-3 and the inner EMI shielding layer 140-1. For example, a positive voltage +V may be applied to the second upper interconnection pattern 171-2, and a negative voltage −V may be applied to the third upper interconnection pattern 171-3. As a result of the application of the positive voltage +V and the negative voltage −V, a current I may flow through the second upper interconnection pattern 171-2, the inner EMI shielding layer 140-1 and the third upper interconnection pattern 171-3 in a direction indicated by arrows. That is, the current I may flow into the second upper interconnection pattern 171-2 and may be drained through the third upper interconnection pattern 171-3. In FIG. 6, the second and third vias (181-2 and 181-3 of FIG. 3) and the second and third lower interconnection patterns (174-2 and 174-3 of FIG. 3) constituting a portion of a current path through which the current I flows are omitted. Resistance values of the second and third vias (181-2 and 181-3 of FIG. 3) and the second and third lower interconnection patterns (174-2 and 174-3 of FIG. 3) may be very small as compared with the resistance values of the resistance values of the second and third upper interconnection patterns 171-2 and 171-3 and the inner EMI shielding layer 140-1. Thus, the resistance values of the second and third vias (181-2 and 181-3 of FIG. 3) and the second and third lower interconnection patterns (174-2 and 174-3 of FIG. 3) may be neglected in a process for calculating the contact resistance value between the second upper interconnection pattern 171-2 and the inner EMI shielding layer 140-1 (or between the third upper interconnection pattern 171-3 and the inner EMI shielding layer 140-1) according to an embodiment. In an embodiment, the positive voltage +V and the negative voltage −V may be applied using voltage sources (or voltage generators), and the current I may be measured using a current meter. In an embodiment, a negative voltage −V may be applied to the second upper interconnection pattern 171-2, and a positive voltage +V may be applied to the third upper interconnection pattern 171-3.

Figure 7:
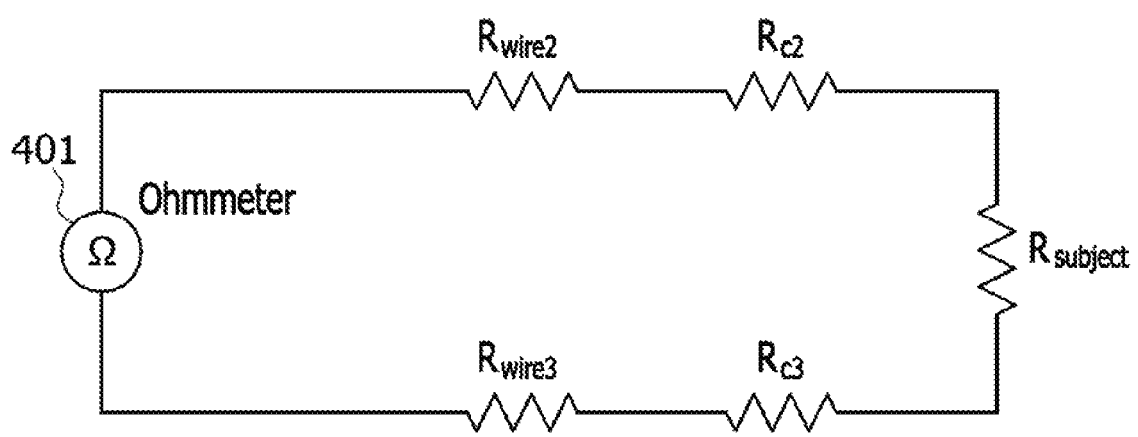

FIG. 7 is an equivalent circuit diagram illustrating the second and third upper interconnection patterns 171-2 and 171-3 and the inner EMI shielding layer 140-1 shown in FIG. 6 with an ohmmeter 401 coupled between the second and third upper interconnection patterns 171-2 and 171-3. As described with reference to FIG. 6, if the positive voltage +V and the negative voltage −V are respectively applied to both the second and third upper interconnection patterns 171-2 and 171-3, a resistor having a resistance value Rwire2 of the second upper interconnection pattern 171-2, a resistor having a second contact resistance value Rc2 between the second upper interconnection pattern 171-2 and the inner EMI shielding layer 140-1, a resistor having a resistance value Rsubject of the inner EMI shielding layer 140-1, a third contact resistance value Rc3 between the third upper interconnection pattern 171-3 and the inner EMI shielding layer 140-1, and a resistor having a resistance value Rwire3 of the third upper interconnection pattern 171-3 are connected in series to provide the equivalent circuit diagram of FIG. 7. Thus, a total resistance value Rtotal1_1 measured by the ohmmeter 401 may be equal to a sum of the resistance values Rwire2, Rc2, Rsubject, Rc3 and Rwire3.

Figure 8:
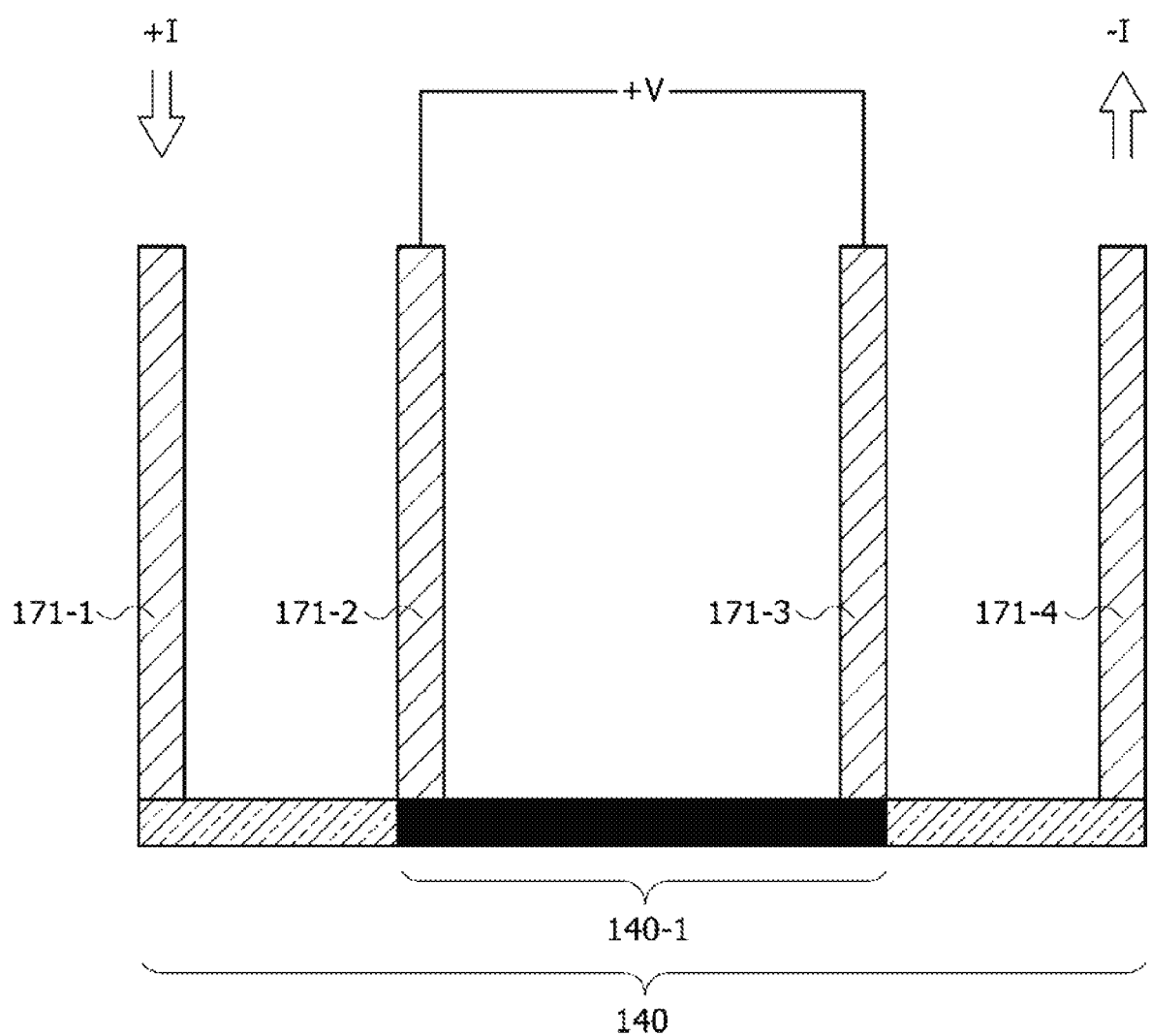

FIG. 8 is a schematic view illustrating a second process step of a method for measuring contact resistance values according to an embodiment of the present disclosure. Referring to FIG. 8, the four-wire probing technique may be applied to the first to fourth upper interconnection patterns 171-1, 171-2, 171-3 and 171-4 disposed in the first region 110A of the package substrate 110 of the semiconductor package (100 of FIG. 1) to measure the resistance value Rsubject of the inner EMI shielding layer 140-1. For example, a current I may be forced into the first upper interconnection pattern 171-1, and the current I may be drained from the fourth upper interconnection pattern 171-4. In such a case, the current I may flow through the first upper interconnection pattern 171-1, a portion of the EMI shielding layer 140 (including the inner EMI shielding layer 140-1), and the fourth upper interconnection pattern 171-4. While the current I is supplied into the first upper interconnection pattern 171-1, a voltage V induced between the second and third upper interconnection patterns 171-2 and 171-3 may be measured. In an embodiment, the current I may be supplied by coupling a current source between the first and fourth upper interconnection patterns 171-1 and 171-4. In addition, the voltage V induced between the second and third upper interconnection patterns 171-2 and 171-3 may be measured by coupling a voltage meter between the second and third upper interconnection patterns 171-2 and 171-3. In some embodiments, a current I may be forced into the fourth upper interconnection pattern 171-4, and the current I may be drained from the first upper interconnection pattern 171-1.

Figure 9:
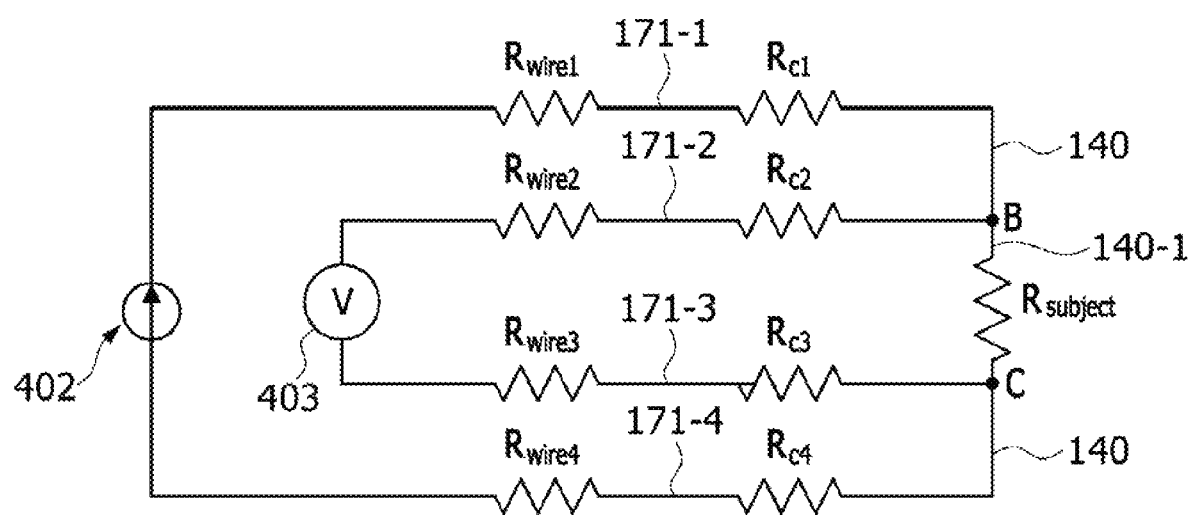

FIG. 9 is an equivalent circuit diagram illustrating the first to fourth upper interconnection patterns 171-1, 171-2, 171-3 and 171-4 and a portion of the EMI shielding layer 140 shown in FIG. 8 with a current source 402 coupled between the first and fourth upper interconnection patterns 171-1 and 171-4 and a voltage meter 403 coupled between the second and third upper interconnection patterns 171-2 and 171-3. As illustrated in FIG. 9, both output terminals of the current source 402 may be connected to one end of the first upper interconnection pattern 171-1 having a resistance value Rwire1 and one end of the fourth upper interconnection pattern 171-4 having a resistance value Rwire4, respectively. The other end of the first upper interconnection pattern 171-1 may be connected to one end of a resistor having a first contact resistance value Rc1. The first contact resistance value Rc1 may correspond to a contact resistance value between the first upper interconnection pattern 171-1 and the EMI shielding layer 140. The other end of the fourth upper interconnection pattern 171-4 may be connected to one end of a resistor having a fourth contact resistance value Rc4. The fourth contact resistance value Rc4 may correspond to a contact resistance value between the fourth upper interconnection pattern 171-4 and the EMI shielding layer 140. A resistance value of a portion of the EMI shielding layer 140 other than the inner EMI shielding layer 140-1 is not related to the method of measuring a contact resistance value according to the present embodiment. Thus, an equivalent resistor having a resistance value of the EMI shielding layer 140 between the first and second upper interconnection patterns 171-1 and 171-2 as well as an equivalent resistor having a resistance value of the EMI shielding layer 140 between the third and fourth upper interconnection patterns 171-3 and 171-4 are not illustrated in FIG. 9.

Both output terminals of the voltage meter 403 may be connected to one end of the second upper interconnection pattern 171-2 having the resistance value Rwire2 and one end of the third upper interconnection pattern 171-3 having the resistance value Rwire3, respectively. The other end of the second upper interconnection pattern 171-2 may be connected to one end B of the inner EMI shielding layer 140-1 having the resistance value Rsubject through the resistor having the second contact resistance value Rc2, and the other end of the third upper interconnection pattern 171-3 may be connected to the other end C of the inner EMI shielding layer 140-1 having the resistance value Rsubject through the resistor having the third contact resistance value Rc3. In the equivalent circuit diagram illustrated in FIG. 9, a resistance value between the two output terminals of the voltage meter 403 is infinite like general voltage meters due to the nature of the voltage meter 403. Thus, while the current source 402 supplies the current I such that the current I flows through the inner EMI shielding layer 140-1, no current flows through the second and third upper interconnection patterns 171-2 and 171-3. Accordingly, the voltage V measured by the voltage meter 403 may correspond to a net voltage drop across the inner EMI shielding layer 140-1. Therefore, the resistance value Rsubject of the inner EMI shielding layer 140-1 may be obtained by dividing the voltage V measured by the voltage meter 403 by the current I supplied from the current source 402.

As described above, the total resistance value Rtotal1_1 between an end of the second upper interconnection pattern 171-2 opposite to the inner EMI shielding layer 140-1 and an end of the third upper interconnection pattern 171-3 opposite to the inner EMI shielding layer 140-1 as well as the resistance value Rsubject of the inner EMI shielding layer 140-1 may be obtained through the first and second process steps described with reference to FIGS. 6 to 9. Thus, if the resistance value Rwire2 of the second upper interconnection pattern 171-2 and the resistance value Rwire3 of the third upper interconnection pattern 171-3 are known, it may be possible to find out the second contact resistance value Rc2 (or the third contact resistance value Rc3) between the second upper interconnection pattern 171-2 (or the third upper interconnection pattern 171-3) and the inner EMI shielding layer 140-1 (i.e., the EMI shielding layer 140). The resistance value Rwire2 and the resistance value Rwire3 may be obtained using the following third process step with an additional interconnection pattern structure disposed in the second region 110B of the package substrate 110 included in the semiconductor package 100 shown in FIG. 1.

Figure 10:
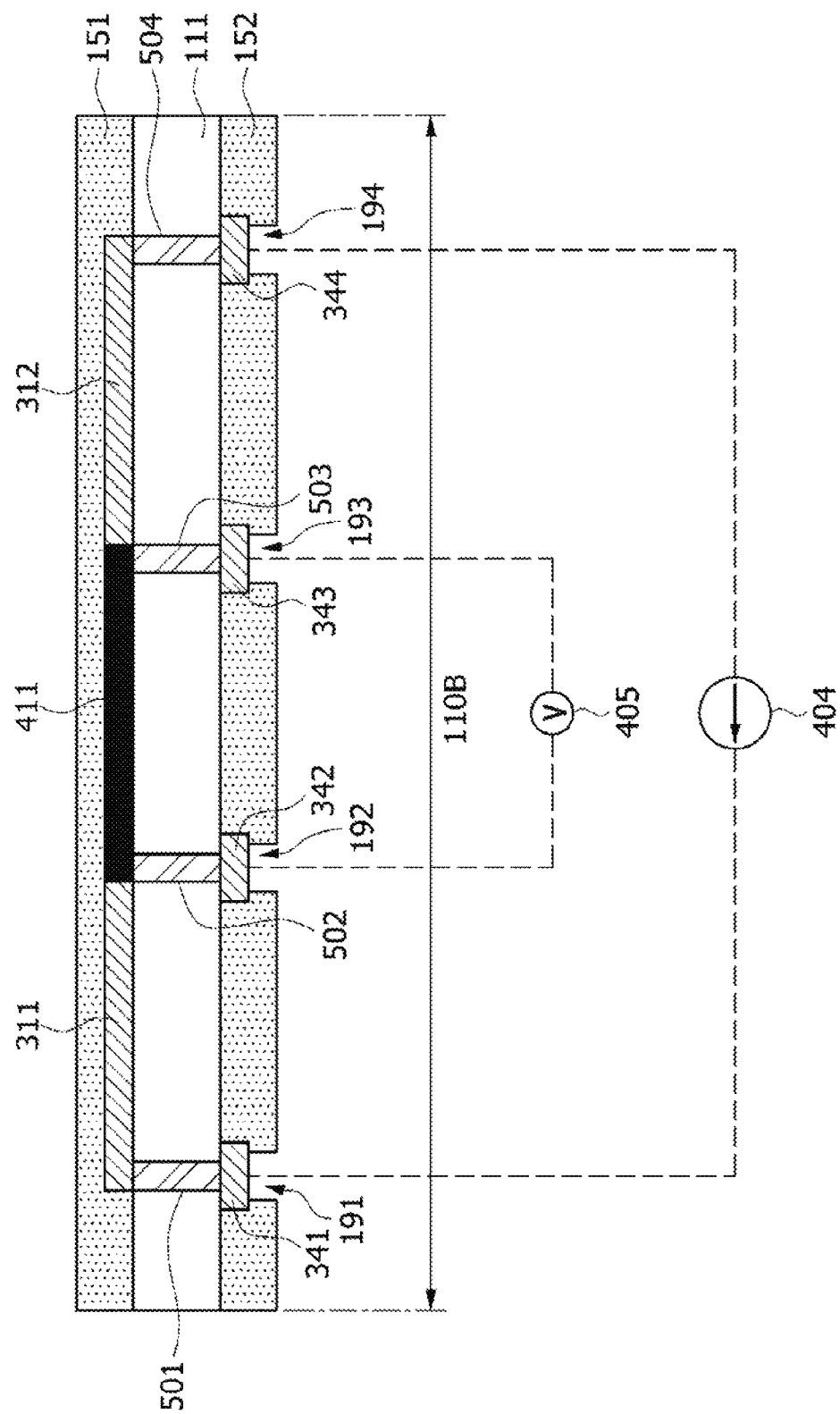
Figure 11:
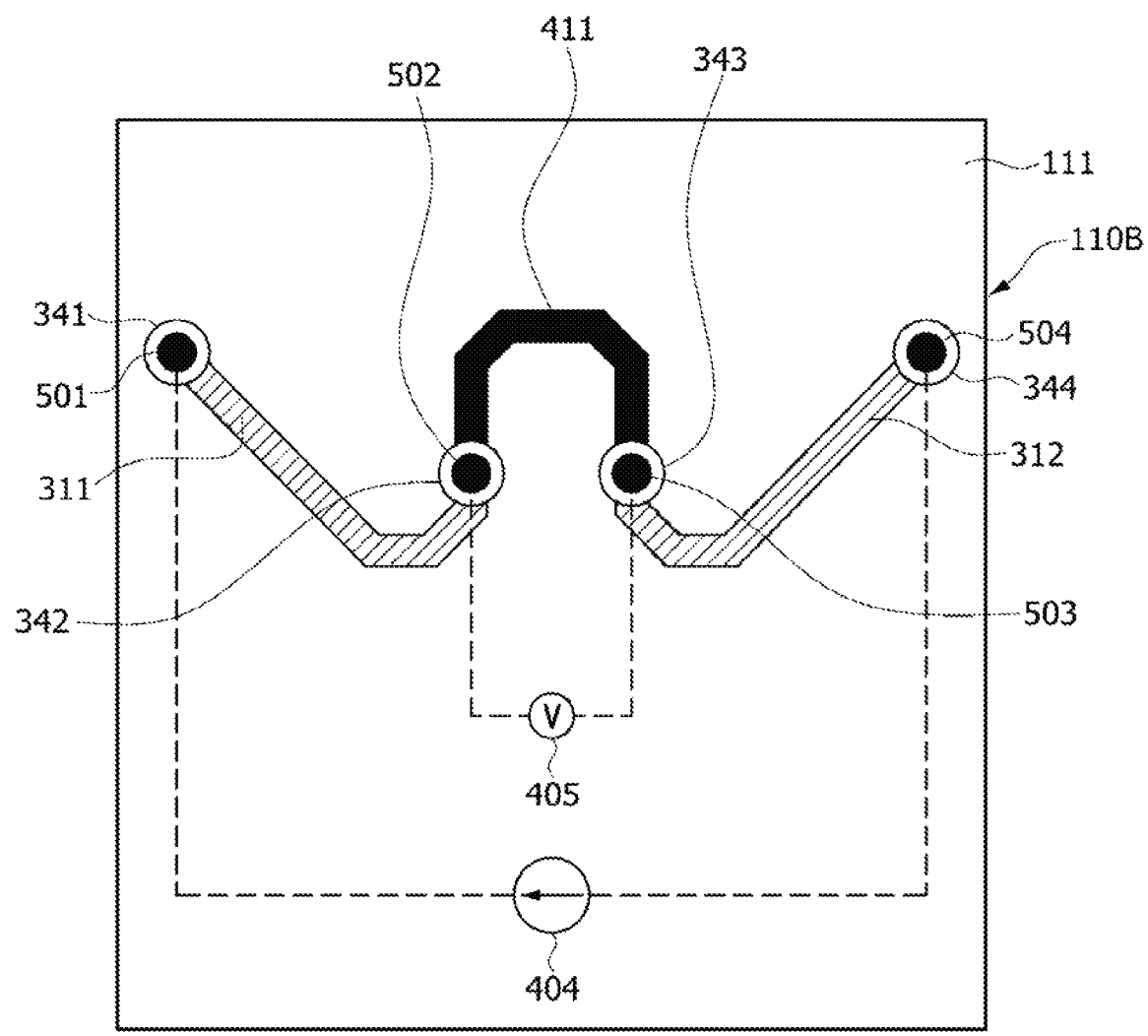
Figure 12:
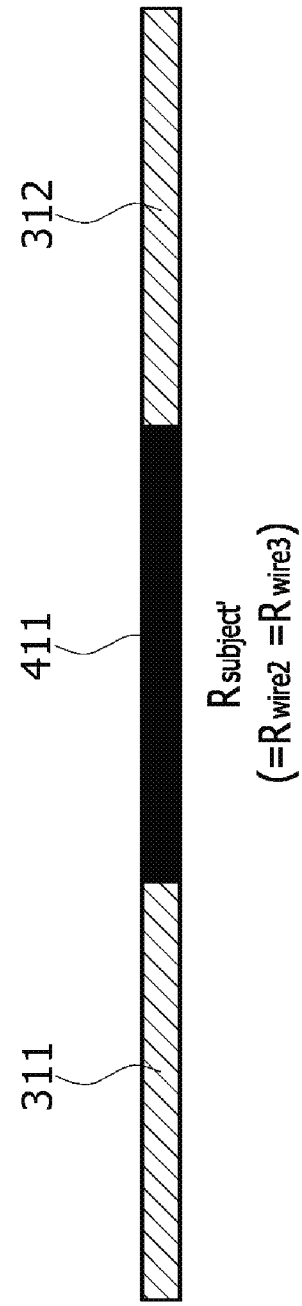

FIGS. 10 and 11 are schematic views illustrating the third process step of a method for measuring contact resistance values according to an embodiment of the present disclosure. FIG. 12 is a schematic view illustrating a resistance value deduced from the third process step. For example, FIG. 10 is a cross-sectional view illustrating a current forcing condition and a voltage measurement condition applied to the additional interconnection pattern structure disposed in the second region 110B of the package substrate 110 included in the semiconductor package 100. In addition, FIG. 11 is a layout diagram illustrating the additional interconnection pattern structure shown in FIG. 10 with the current forcing condition and the voltage measurement condition.

Referring to FIGS. 10 and 11, a current source 404 may be coupled between the first additional lower interconnection pattern 341 and the fourth additional lower interconnection pattern 344. In an embodiment, polarities of two output terminals of the current source 404 may be set such that a current generated by the current source 404 flows into the first additional lower interconnection pattern 341 and the current is drained from the fourth additional lower interconnection pattern 344. In such a case, a voltage meter 405 may be coupled between the second additional lower interconnection pattern 342 and the third additional lower interconnection pattern 343. Since a resistance value between the two output terminals of the voltage meter 405 is infinite, no current flows through the second and third additional lower interconnection patterns 342 and 343 even though the current source 404 supplies the current into the first additional lower interconnection pattern 341. Thus, the current generated by the current source 404 may flow through the first additional lower interconnection pattern 341, the first additional via 501, the first additional upper interconnection pattern 311, the connection pattern 411, the second additional upper interconnection pattern 312, the fourth additional via 504 and the fourth additional lower interconnection pattern 344. Accordingly, an amount of the current flowing through the connection pattern 411 may be equal to an amount of the current generated by the current source 404. Moreover, a voltage induced between both ends of the connection pattern 411 may be equal to a voltage measured by the voltage meter 405. Therefore, a resistance value (corresponding to the resistance value Rsubject') of the connection pattern 411 may be obtained by dividing the voltage measured by the voltage meter 405 by the current generated by the current source 404 (see FIG. 12).

Since the connection pattern 411 disposed in the second region 110B of the package substrate (110 of FIG. 1) has the same thickness and width as each of the second upper interconnection pattern 171-2 and the third upper interconnection pattern 171-3, the resistance value Rsubject' measured using the current source 404 and the voltage meter 405 may be substantially equal to each of the resistance value Rwire2 of the second upper interconnection pattern 171-2 and the resistance value Rwire3 of the third upper interconnection pattern 171-3 if the connection pattern 411 has substantially the same length as each of the second upper interconnection pattern 171-2 and the third upper interconnection pattern 171-3. In some embodiments, because the connection pattern 411 disposed in the second region 110B of the package substrate (110 of FIG. 1) has the same thickness, width, and material as each of the second upper interconnection pattern 171-2 and the third upper interconnection pattern 171-3, the resistance value Rsubject' measured using the current source 404 and the voltage meter 405 may be substantially equal to each of the resistance value Rwire2 of the second upper interconnection pattern 171-2 and the resistance value Rwire3 of the third upper interconnection pattern 171-3 if the connection pattern 411 has substantially the same length as each of the second upper interconnection pattern 171-2 and the third upper interconnection pattern 171-3. Meanwhile, if the connection pattern 411 has a different length from the second upper interconnection pattern 171-2 and the third upper interconnection pattern 171-3, a resistance value per unit length of the connection pattern 411 may be obtained by dividing the resistance value Rsubject' by the length of the connection pattern 411. In such a case, the resistance value per unit length of the connection pattern 411 may be substantially equal to a resistance value per unit length of the second upper interconnection pattern 171-2 (or the third upper interconnection pattern 171-3). Thus, the resistance value Rwire2 of the second upper interconnection pattern 171-2 may be obtained by multiplying the resistance value per unit length of the connection pattern 411 by the length of the second upper interconnection pattern 171-2, and the resistance value Rwire3 of the third upper interconnection pattern 171-3 may be obtained by multiplying the resistance value per unit length of the connection pattern 411 by the length of the third upper interconnection pattern 171-3.

Figure 13:
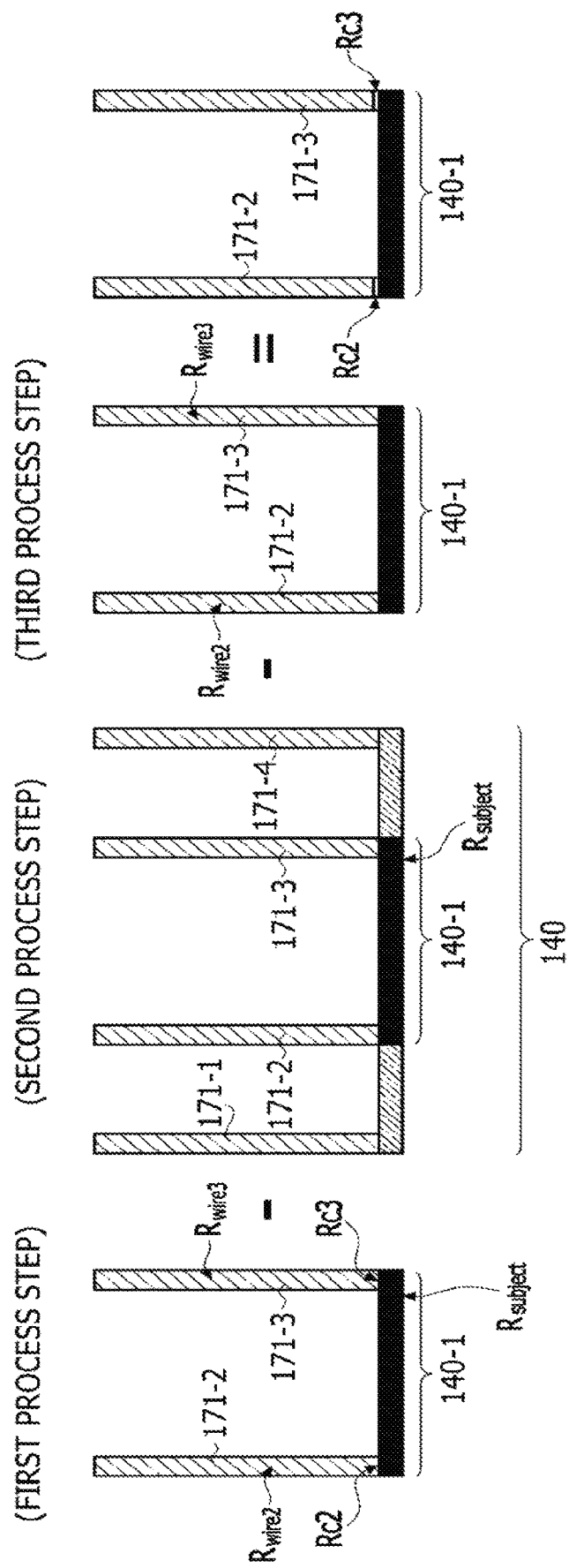

FIG. 13 is a schematic view illustrating a calculation procedure for obtaining contact resistance values according to an embodiment of the present disclosure with the first to third process steps described with reference to FIGS. 6 to 12. Referring to FIG. 13, at the first process step, the two-wire probing technique may be applied to the second and third upper interconnection patterns 171-2 and 171-3 disposed in the first region 110A of the package substrate 110 of the semiconductor package (100 of FIG. 1) to obtain the total resistance value "Rwire2+Rwire3+Rsubject+Rc2+Rc3" corresponding to a sum of the resistance value Rwire2 of the second upper interconnection pattern 171-2, the resistance value Rwire3 of the third upper interconnection pattern 171-3, the resistance value Rsubject of the inner EMI shielding layer 140-1, the second contact resistance value Rc2 between the second upper interconnection pattern 171-2 and the inner EMI shielding layer 140-1, and the third contact resistance value Rc3 between the third upper interconnection pattern 171-3 and the inner EMI shielding layer 140-1. At the second process step, the four-wire probing technique may be applied to the first to fourth upper interconnection patterns 171-1, 171-2, 171-3 and 171-4 disposed in the first region 110A of the package substrate (110 of FIG. 1) to obtain the resistance value Rsubject of the inner EMI shielding layer 140-1. In addition, at the third process step, the resistance value Rwire2 of the second upper interconnection pattern 171-2 and the resistance value Rwire3 of the third upper interconnection pattern 171-3 may be calculated using the additional interconnection pattern structure disposed in the second region 110B of the package substrate (110 of FIG. 1). Accordingly, the second and third contact resistance values Rc2 and Rc3 may be obtained by subtracting the resistance value Rsubject of the inner EMI shielding layer 140-1 measured at the second process step and the resistance values Rwire2 and Rwire3 of the second and third upper interconnection patterns 171-2 and 171-3 measured at the third process step from the total resistance value "Rwire2+Rwire3+Rsubject+Rc2+Rc3" measured at the first process step. For example, the addition of the second and third contact resistance values Rc2 and Rc3 may be obtained by subtracting the resistance value Rsubject of the inner EMI shielding layer 140-1 measured at the second process step and the resistance values Rwire2 and Rwire3 of the second and third upper interconnection patterns 171-2 and 171-3 measured at the third process step from the total resistance value "Rwire2+Rwire3+Rsubject+Rc2+Rc3" measured at the first process step. In an embodiment, the addition of the second and third contact resistance values Rc2 and Rc3 equal the total resistance value "Rwire2+Rwire3+Rsubject+Rc2+Rc3" measured at the first process step minus the resistance value Rsubject of the inner EMI shielding layer 140-1 measured at the second process step and minus the resistance values Rwire2 and Rwire3 of the second and third upper interconnection patterns 171-2 and 171-3 measured at the third process step.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A semiconductor package comprising:
a package substrate;
a semiconductor chip mounted on the package substrate;
a molding member disposed on the package substrate to surround the semiconductor chip; and
an electromagnetic interference (EMI) shielding layer disposed on side surfaces of the package substrate and on the molding member,
wherein the package substrate comprises:
a substrate body having a first surface and a second surface which are opposite to each other;

first to fourth upper interconnection patterns disposed on the first surface of the substrate body in a first region of the package substrate and in contact with the EMI shielding layer; and an interconnection structure including a first additional upper interconnection pattern and a second additional upper interconnection pattern, the interconnection structure disposed in a second region of the package substrate, wherein the interconnection structure further comprises a connection pattern coupled between the first and second additional upper interconnection patterns, wherein the interconnection structure is disposed on the first surface of the substrate body, wherein a resistance value per unit length of the connection pattern is substantially the same as a resistance value per unit length of each of the at least two of the first to fourth upper interconnection patterns, and wherein the connection pattern has substantially the same thickness and width as each of at least two of the first to fourth upper interconnection patterns.

2. The semiconductor package of claim 1, wherein the first region includes edge portions of the package substrate, and the second region is surrounded by the first region.

3. The semiconductor package of claim 1, wherein side surfaces of first ends of the first to fourth upper interconnection patterns are substantially vertically aligned with a side surface of the substrate body and are in contact with the EMI shielding layer.

4. The semiconductor package of claim 1, further comprising first to fourth lower interconnection patterns which are disposed on the second surface of the substrate body and connected to respective ones of second ends of the first to fourth upper interconnection patterns through vias.

5. The semiconductor package of claim 4, wherein the first to fourth upper interconnection patterns are electrically connected to the first to fourth lower interconnection patterns such that signals are independently applied to or detected from the first to fourth upper interconnection patterns through connection members.

6. The semiconductor package of claim 1, wherein the connection pattern comprises substantially the same material as each of the at least two of the first to fourth upper interconnection patterns.

7. The semiconductor package of claim 1, wherein the connection pattern has substantially the same length as each of the at least two of the first to fourth upper interconnection patterns.

* * * * *